United States Patent
Iyechika et al.

(10) Patent No.: US 7,205,577 B2
(45) Date of Patent: Apr. 17, 2007

(54) GROUP 3-5 COMPOUND SEMICONDUCTOR AND LIGHT EMITTING DIODE

(75) Inventors: Yasushi Iyechika, Tsukuba (JP); Yoshihiko Tsuchida, Tsukuba (JP); Yoshinobu Ono, Ibaraki (JP); Masaya Shimizu, Tsukuba (JP)

(73) Assignee: Sumitomo Chemical Company, Limted, Osaka (JP)

( * ) Notice: Subject to any disclaimer, the term of this patent is extended or adjusted under 35 U.S.C. 154(b) by 0 days.

(21) Appl. No.: 10/162,404

(22) Filed: Jun. 5, 2002

(65) Prior Publication Data

US 2003/0001153 A1    Jan. 2, 2003

(30) Foreign Application Priority Data

Jun. 7, 2001    (JP)    .............................. 2001-172262

(51) Int. Cl.
*H01L 33/00*    (2006.01)
(52) U.S. Cl. ...................................................... 257/98
(58) Field of Classification Search ................ 257/88, 257/83, 91, 92, 95, 98, 99, 100, 103, 79, 257/E33.01, E31.036, E29.069
See application file for complete search history.

(56) References Cited

U.S. PATENT DOCUMENTS

| | | | |
|---|---|---|---|
| 6,023,077 A | 2/2000 | Iyechika et al. | |
| 6,233,265 B1 * | 5/2001 | Bour et al. | 372/45 |
| 6,384,430 B1 * | 5/2002 | Nakatsu et al. | 257/103 |
| 6,479,836 B1 * | 11/2002 | Suzuki et al. | 257/15 |
| 6,521,917 B1 * | 2/2003 | Takayama et al. | 257/103 |
| 6,542,526 B1 * | 4/2003 | Niwa et al. | 372/45 |
| 2003/0006418 A1 * | 1/2003 | Emerson et al. | 257/79 |
| 2003/0010993 A1 * | 1/2003 | Nakamura et al. | 257/99 |

FOREIGN PATENT DOCUMENTS

| | | |
|---|---|---|
| JP | A-7-302929 | 11/1995 |
| JP | A-8-70139 | 3/1996 |
| WO | WO 01/39282 A2 | 5/2001 |

* cited by examiner

*Primary Examiner*—Thomas Dickey
*Assistant Examiner*—Tan Tran
(74) *Attorney, Agent, or Firm*—Birch, Stewart, Kolasch & Birch, LLP

(57) ABSTRACT

A group 3–5 compound semiconductor comprising an interface of two layers having lattice mismatch, an intermediate layer having a film thickness of 25 nm or more and a quantum well layer, in this order. The compound semiconductor has high crystallinity and high quality, and suitably used for a light emitting diode.

8 Claims, 2 Drawing Sheets

GROUP 3-5 COMPOUND SEMICONDUCTOR AND LIGHT EMITTING DIODE

BACKGROUND OF THE INVENTION

1. Field of the Invention

The present invention relates to a nitride-based group 3–5 compound semiconductor, more particularly, to a nitride-based group 3–5 compound semiconductor represented by the general formula $In_xGa_yAl_zN$ (wherein, $x+y+z=1$, $0 \leq x \leq 1$, $0 \leq y \leq 1$, $0 \leq z \leq 1$.

2. Description of the Related Art

As the material of light emitting diodes such as an ultraviolet or blue light emitting diode or blue laser diode and the like, group 3–5 compound semiconductors represented by the general formula $In_xGa_yAl_zN$ (wherein, $x+y+z=1$, $0 \leq x \leq 1$, $0 \leq y \leq 1$, $0 \leq z \leq 1$) are known. Hereinafter, x, y and z in this general formula are described as InN mixed crystal ratio, GaN mixed crystal ratio and AlN mixed crystal ratio, respectively, in some cases. Of these group 3–5 compound semiconductors, particularly those containing InN in an amount of 10% or more in terms of mixed crystal ratio are particularly important for display use since light emitting wavelength in the visible region can be controlled depending on InN mixed crystal ratio.

In semiconductor light emitting diodes, a light emitting layer may be formed of multiple layers. Unless the layers have the same structure, the light emitting spectrum is an overlap of different spectrums of the layers and resultantly broadens totally. Namely, the color purity of the emitted light decreases. On the other hand, when a single light emitting layer is used, such a problem can be avoided. Further, in the case of application to a laser, when a light emitting layer is composed of a plurality of layers, the whole film thickness of the light emitting layer increases, consequently also leading to an increase in the absorption of light by the light emitting layer itself. Therefore, the minimum current required for laser oscillation can be decreased by a single layer structure of the light emitting layer.

On the other hand, in nitride-based compound semiconductors, a crystal having sufficiently high quality and large area as to enable use in crystal growth is not obtained. Therefore, growth on different substrates, so-called heteroepitaxial growth is generally conducted. Namely, using substrates having relatively near lattice constants such as sapphire, SiC and the like, an amorphous or fine crystalline thin film called a buffer layer is first grown, and a crystal of this compound semiconductor is grown on this. However, it is common that very high density dislocation of about $10^8$ cm$^{-2}$ is present also on the thus obtained crystal. Because of such a reason, it is very difficult to form a thin film having high uniformity from this compound semiconductor, leading to difficulty in realizing high light emitting efficiency by a single light emitting layer. Consequently, under current conditions, light emitting efficiency is enhanced by using a so-called multiple quantum well using multiple light emitting layers laminated in light emitting diodes using nitride-based compound semiconductors.

An object of the present invention is to provide a single quantum well and a light emitting diode obtained by using this by a nitride-based group 3–5 compound semiconductor having high crystallinity and high quality.

SUMMARY OF THE INVENTION

The present invention provides (1) a group 3–5 compound semiconductor comprising at least one interface of two layers having lattice mismatch, an intermediate layer having a film thickness of 25 nm or more and a quantum well layer, in this order.

Also, the present invention provides (2) a light emitting diode obtained by using the above-mentioned compound semiconductor.

Figure 1:
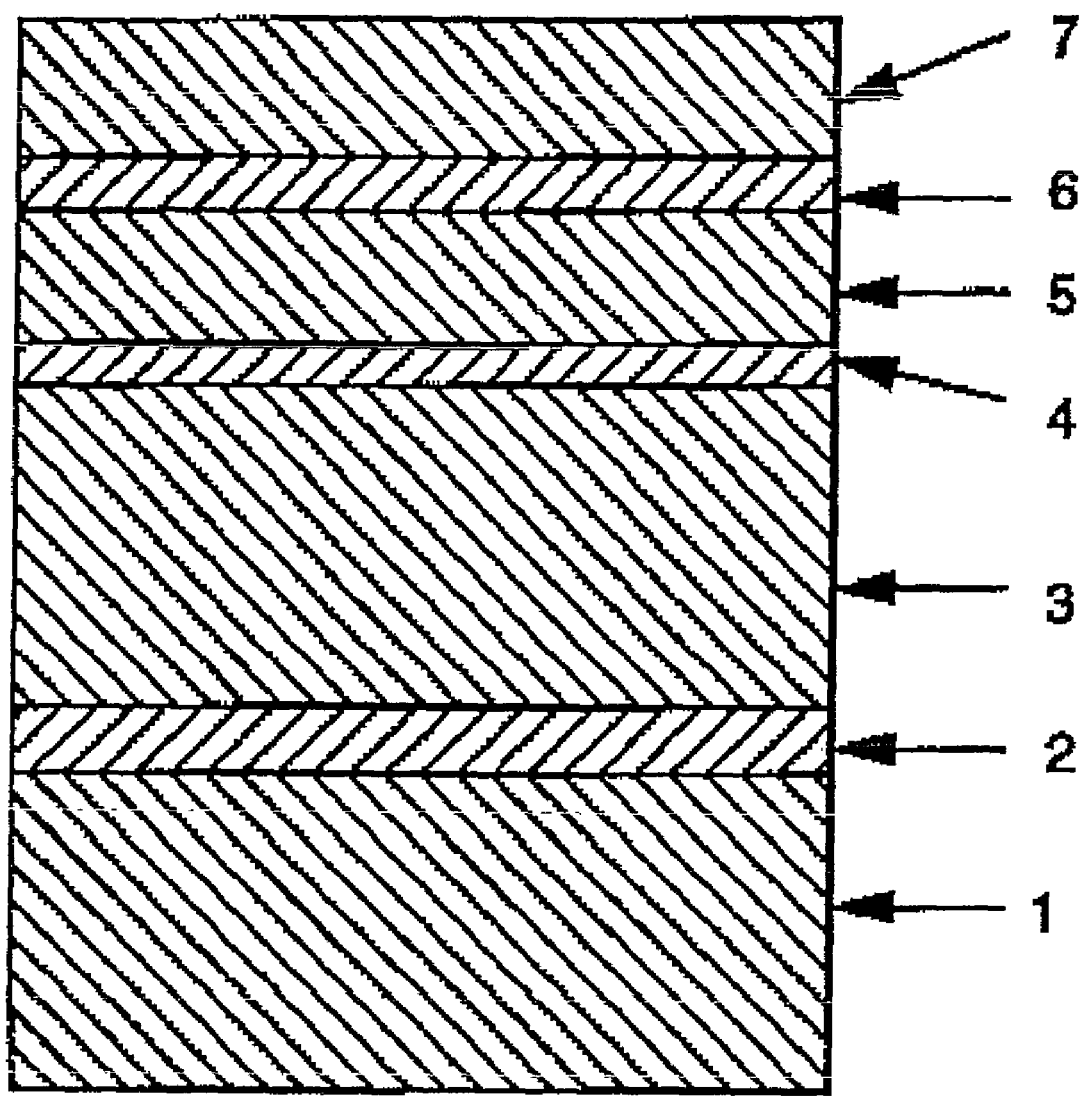
FIG. 1 is a view showing one example of the group 3–5 compound semiconductor of the present invention.

1: Substrate
2: Buffer layer
3: GaN layer
4: InGaN layer
5: Intermediate layer
6: Well layer
7: AlGaN barrier layer
8: Si-doped n-GaN layer
9: Undoped GaN layer
10: Si-doped n-GaN layer

DETAILED DESCRIPTION OF THE INVENTION

The nitride-based group 3–5 compound semiconductor of the invention has the interface of two layers having lattice mismatch, an intermediate layer and a single quantum well structure, in this order, on a substrate.

A quantum well layer means a layer represented by the general formula $In_xGa_yAl_zN$ (wherein, $x+y+z=1$, $0 \leq x \leq 1$, $0 \leq y \leq 1$, $0 \leq z \leq 1$) having a film thickness of 5 Å or more and 90 Å or less and being sandwiched by and in contact with two layers represented by the general formula $In_{x'}Ga_{y'}Al_{z'}N$ (wherein, $0 \leq x' \leq 1$, $0 \leq y' \leq 1$, $0 \leq z' \leq 1$, $x'+y'+z'=1$) having larger band gap than the quantum well layer. Hereinafter, layers sandwiching the quantum well layer are described as a barrier layer, and the quantum well layer is described simply as a well layer, in some cases. Further, the quantum well layer and barrier layer are described as a quantum well structure together, in some cases. In the general formula representing two barrier layers, x', y' and z' may be mutually the same or different.

The difference in band gap of a barrier layer and a well layer is preferably 0.1 eV or more. When this difference in band gap is less than 0.1 eV, confinement of carriers into a well layer is not sufficient, and light emitting efficiency decreases when used as a light emitting diode. More preferably, it is 0.3 eV or more. However, when the band gap of a barrier layer is over 5 eV, the voltage necessary for charge injection increases. The band gap of a barrier layer is therefore preferably 5 eV or less.

The intermediate layer in the present invention is characterized in that it is sandwiched between the well layer and the nearest interface to the well layer among the interfaces having lattice mismatch, may be constituted of a plurality of layers, and has a total film thickness of 25 nm or more. More preferably, the film thickness is 30 nm or more. When the thickness of the intermediate layer is less than 25 nm, the effect of the present invention may not be manifested, in some cases.

Such an intermediate layer may be in contact with a well layer, and in this case, it acts also as a barrier layer. The intermediate layer may form an interface with another layer having lattice mismatch, and in this case, it acts as a layer of the well layer side of two layers forming the interface. Further, the intermediate layer may also be in contact with a well layer and form an interface with another layer having lattice mismatch, and in this case, the intermediate layer acts as a barrier layer and also as a layer of the well layer side of two layers forming the interface.

In the invention, it is necessary that at least one interface of two layers having lattice mismatch is present.

Here, the term "having lattice mismatch" means that two layers have different lattice constants along the interface direction, and in the case of connection of two layers having lattice mismatch, lattice strain is generated so as to match the lattice constant along the interface direction of a layer to that of another layer mutually. In general, due to stress applied to a crystal, the crystal gets a lattice constant different from the original lattice constant.

When two layers having lattice mismatch are mutually in contact and the two layers have the original lattice constants respectively along the interface direction, lattice strain does not exist, and lattice strain is completely relaxed. When two layers having lattice mismatch have virtually the same lattice constant along the interface direction, relaxation of lattice strain is not present at all. When two layers having lattice mismatch are connected and lattice strain is partially relaxed, though the lattice constants along the connected surface direction are different between two layers, an intermediate lattice constant is exhibited between the case of complete relaxation and the case of virtually no relaxation, differing also from the case of no lattice strain.

Regarding the preferable magnitude of lattice mismatch in the present invention, specifically, the absolute value is 0.01% or more and 5% or less. Here, the magnitude of lattice mismatch is calculated, based on lattice constant along the interface direction of a layer of the substrate side, by dividing a difference of lattice constant along the interface direction of a layer laminated on the layer of the substrate side from the lattice constant of the layer of the substrate side, by the lattice constant of the layer of the substrate side. When the absolute value of lattice mismatch is less than 0.01% or over 5%, the effect of the present invention is not remarkable.

Regarding a mixed crystal containing group 3 elements other than Ga, particularly those containing In, of the above-mentioned compound semiconductors, it is generally difficult to grow a thick film of high quality. Therefore, in the invention, it is preferable that at least one layer of layers constituting the interface of layers having lattice mismatch is a mixed crystal showing lattice conformity with GaN or GaN. Further, in layers forming an interface having lattice mismatch in the invention, the effect is more remarkable and preferable in the case of application of compressive strain by lattice mismatch than in the case of application of tensile strain.

The effect of the invention is particularly large in the case of a lamination structure in which one layer of layers forming an interface having lattice mismatch is made of GaN and another layer has larger lattice constant than that of GaN.

Regarding layers forming an interface having lattice mismatch, it is preferable that band gap thereof is larger than the band gap of a well layer since charge injection into the well layer is not prevented. Specifically, when an InGaN quantum well layer is provided as a light emitting layer, it is desirable that layers forming an interface having lattice mismatch are constituted of AlGaN, GaN, InGaN having smaller InN mixed crystal ratio than that of the light emitting layer, and InGaAlN having larger band gap than that of the light emitting layer. For growth of these layers, a method of feeding raw materials may be controlled, and growth temperature may be controlled. Particularly in the case of InGaN, growth temperature can be raised for control for growth of a layer having smaller InN mixed crystal ratio, for example, since InN mixed crystal ratio depends intensively on the growth temperature.

One example of the structure of a group 3–5 compound semiconductor of the invention is shown in FIG. 1. In the example of FIG. 1, a buffer layer 2, GaN layer 3, InGaN layer 4, GaN layer 5, InGaN layer 6 and GaAlN layer 7 are laminated in this order on a substrate 1. The interface between the GaN layer 3 and the InGaN layer 4 and the interface between the InGaN layer 4 and the GaN layer 5 are the interfaces of two layers having lattice mismatch of the invention, the GaN layer 5 is an intermediate layer, the InGaN layer 6 is a well layer and the GaN layer 5 and AlGaN layer 7 are barrier layers. The GaN layer 5 constitutes one of two layers having lattice mismatch and simultaneously acts as an intermediate layer and further as a barrier layer. The GaN layer 5, intermediate layer, has a film thickness of 30 nm or more. The InGaN layer 6, well layer, has a film thickness of 5 Å or more and 90 Å or less.

Though the example shown in FIG. 1 describes a simple constitution case for illustrating the content of the invention simply, further more complicated constitutions may be provided within a range not restricting the content of the present invention.

For example, though the number of the constituent elements in each layer is two such as GaN or 3 such as GaAlN and InGaN, a mixed crystal generally represented by InGaAlN can also be adopted.

Further, the GaN layer 5 which is an intermediate layer and the InGaN layer 6 which is a well layer are in direct contact in this example, however, one or more layers may also be provided between them. In this example, the interface of two layers having lattice mismatch and the GaN layer 5 which is an intermediate layer are in direct contact, however, one or more layers may further be provided between the intermediate layer and the interface of two layers having lattice mismatch. Furthermore, in the example of FIG. 1, the interface of two layers having lattice strain is formed at two positions, namely, at the interface between the GaN layer 3 and the InGaN layer 4, and the interface between then InGaN layer 4 and the GaN layer 5, however, one or three or more interfaces may also be formed.

Examples of the above mentioned three or more interfaces are superlattice of GaN and InGaN or superlattice of GaN and GaAlN.

The extent of relaxation of lattice mismatch depends on the magnitude of lattice mismatch, the thicknesses of individual layers forming the interface of layers having lattice mismatch, and physical properties such as elastic modulus and the like. It is preferable that relaxation is as small as possible since relaxation is generally accompanied by dislocations.

The substrate used in the invention and the growth method are described below. As the substrate for growth of the crystal of the group 3–5 compound semiconductor, sapphire, ZnO, GaAs, Si, SiC, NGO ($NdGaO_3$), spinel ($MgAl_2O_4$), GaN and the like are used. Particularly sapphire is important since it is transparent and forms a crystal of high quality having large area.

As the method of producing the group 3–5 compound semiconductor, a molecular beam epitaxy (hereinafter, abbreviated as MBE in some cases) method, an metalorganic vapor phase epitaxy (hereinafter, abbreviated as MOVPE in some cases) method, a hydride vapor phase epitaxy (hereinafter, abbreviated as HVPE in some cases) method, and the like are listed. When the MBE method is used, there is generally used a gas source molecular beam epitaxy (hereinafter, abbreviated as GSMBE) method which is a method of feeding a nitrogen gas, ammonia, and other nitrogen compounds in the form of gas, as nitrogen raw materials. In this case, nitrogen raw materials are chemically inactive and a nitrogen atom may not be incorporated in a crystal easily. In this case, the incorporation efficiency of nitrogen can be raised by exciting nitrogen raw materials by microwave and the like to give activated materials to be fed.

EXAMPLES

The following examples illustrate the invention further in detail below, but do not limit the scope of the invention.

Example 1

Figure 2:
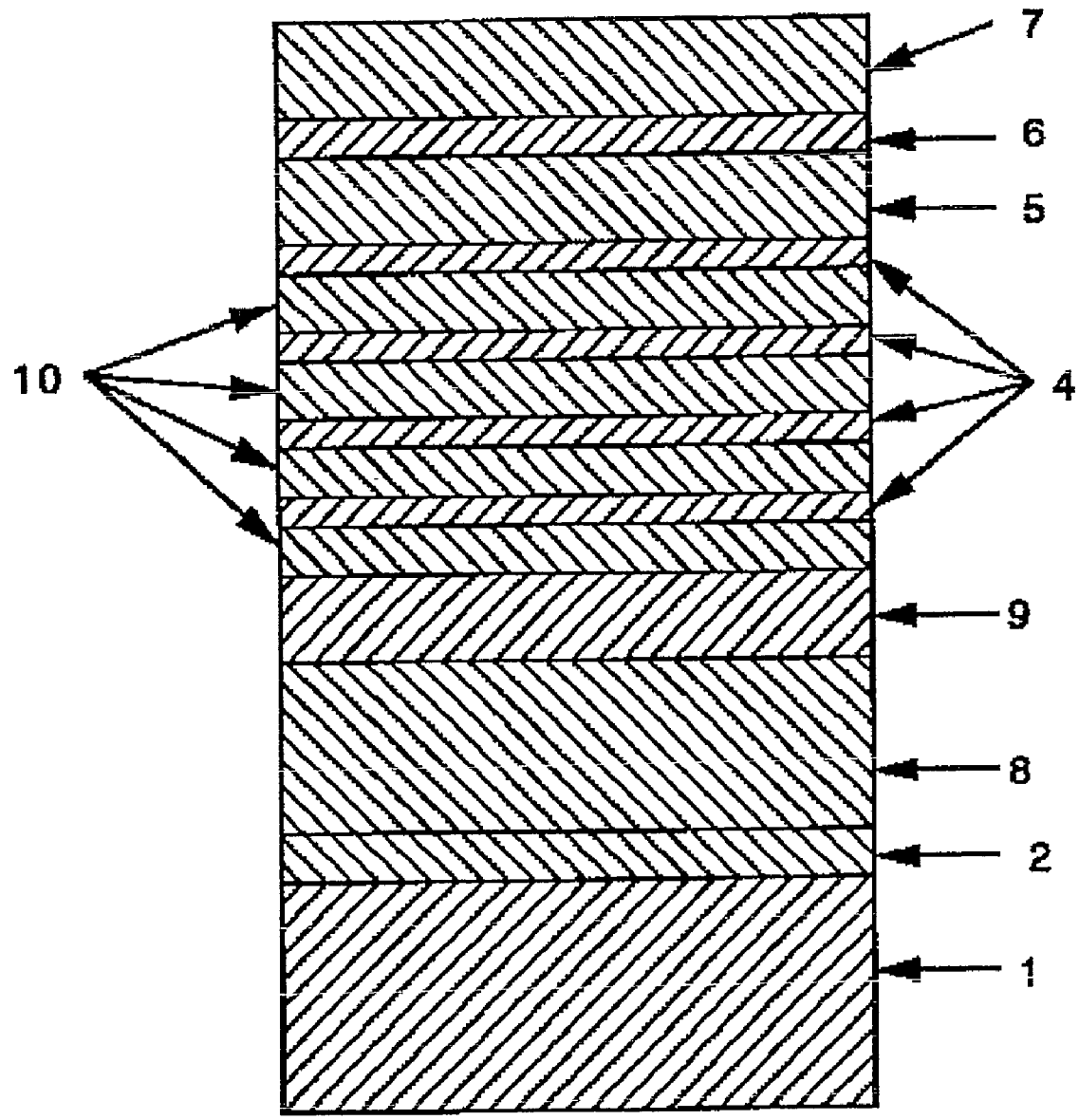
FIG. 2 is a view showing a light emitting diode of the present invention produced in Example 1.

A group 3–5 compound semiconductor having a structure shown in FIG. 2 was produced by the MOVPE method. As the substrate 1, a sapphire of specular-polished C surface was washed with an organic material before use. As the growth method, a two-step growth method was used using GaN as a low temperature grown buffer layer. The temperature of a susceptor carrying the substrate was controlled to 550° C., and a GaN buffer layer 2 having a thickness of about 50 nm was grown. Then at 1060° C., an n-type layer 8 made of GaN doped with Si having a thickness of about 3 μm and a undoped GaN layer 9 of 150 nm were grown using hydrogen as a carrier gas.

Next, 17 nm of a GaN layer 10 doped with Si and 3 nm of an InGaN layer 4 having no lattice relaxation were grown alternately four times using nitrogen as a carrier gas and silane diluted to 1 ppm with the nitrogen, TEG, TMI and ammonia as raw materials, at a susceptor temperature of 825° C. The InN mixed crystal ratio of the InGaN layer was 10% and it has 1.1% lattice mismatch in a-axis with GaN. Further, the temperature of the susceptor was changed to 785° C., and 100 nm of the GaN layer 5 doped with Si which is an intermediate layer, 3 nm of the InGaN layer 6 which is a well layer and 6.5 nm of the AlGaN layer 7 which is a barrier layer were grown.

After growth, the sample was removed, and photoluminescence was measured at room temperature using He—Cd laser (325 nm) as an excitation light source. Light emission from the well layer was observed as a spectrum having a peak at 457 nm, and the peak strength was 6.87 fold based on the standard sample. In the measurement of photoluminescence, also the peak from the ground layer, InGaN layer, grown at 825° C. was observed at 406 nm, and the intensity thereof was 7.53-fold based on the standard sample. The standard sample was produced in Comparative Example 1 as described below.

Comparative Example 1

In the procedure of Example 1 , after growth of a un-doped layer at 1060° C., a GaN layer doped with Si, an InGaN layer which is a well layer and an AlGaN layer which is a barrier layer were grown directly at 785° C., without growing the GaN layer and InGaN layer at 825° C. This sample has the same structure as in Example 1 except that the interface of two layers having lattice mismatch is not contained. This was evaluated by way of photoluminescence in the same manner as in Example 1.

Comparative Example 2

A sample was produced in the same manner as in Example 1 excepting that the thickness of the intermediate layer was 17 nm. This was evaluated by way of photoluminescence in the same manner as in Example 1 to find that the peak intensity of light emission from the well layer manifested an intensity of only 1.37-fold based on the standard sample.

Example 2

A sample was produced in the same manner as in Example 1 excepting that after growth of a undoped GaN layer at 1060° C., all the layers were grown at a susceptor temperature of 785° C. This was evaluated by way of photoluminescence in the same manner as in Example 1 to find that the peak intensity was 13.1-fold based on the standard sample. The InN mixed crystal ratio in the InGaN layer was 17% and it has 1.9% lattice mismatch in a-axis with GaN. This photoluminescence intensity includes contribution from InGaN in the underground layer and contribution from quantum well on the outermost surface. Since the photoluminescence intensity of the InGaN layer in the underground layer in Example 1 was 7.53-fold based on the standard sample, the contribution to the peak intensity from the InGaN well layer on the outermost layer functioning as a light emitting layer in a LED structure, of photoluminescence intensities in this example, was calculated to be 5.60-fold based on the standard sample, by subtracting contribution from the underground layer.

Example 3

A sample was produced in the same manner as in Example 2 excepting that InGaN in the layers other than the well layer was substituted by AlGaN in Example 2. The AlN mixed crystal ratio in the AlGaN layer was 15% and it has −0.3% lattice mismatch in a-axis with GaN. This was evaluated by way of photoluminescence in the same manner as in Example 1 to find that the peak intensity was 3.20-fold based on the standard sample.

Example 4

A sample was produced in the same manner as in Example 1 excepting that the thickness of GaN doped with Si of the intermediate layer was changed from 100 nm to 50 nm. This was evaluated by way of photoluminescence in the same manner as in Example 1 to find that the peak intensity was 3.60-fold based on the standard sample.

Example 5

On the sample of the examples, a p-type layer was further laminated, to obtain an epi-wafer for LED. This can be further subjected to electrode formation according to an ordinary method, to give LED. Thus obtained LED is LED emitting light from a single quantum well having improved property.

The group 3–5 compound semiconductor of the invention has high crystallinity and high quality, and a light emitting diode obtained by using this manifests high light emitting efficiency and has a high industrial value.

What is claimed is:

1. A group 3–5 nitride-based compound semiconductor comprising:
   a substrate;
   a Si-doped n-GaN layer, said Si-doped n-GaN layer being over the substrate;
   an undoped GaN layer, said undoped GaN layer being over the Si-doped n-GaN layer;
   a superlattice of GaN and a compound semiconductor represented by the general formula $In_xGa_yN$ (wherein, x+y=1, 0<x<1, 0<y<1), said superlattice being over the undoped GaN layer;
   an intermediate layer having a film thickness of 25 nm or more, said intermediate layer being over the superlattice; and
   a single quantum well structure, wherein said superlattice and said intermediate layer are between the single quantum well structure and the substrate.

2. The group 3–5 compound semiconductor according to claim 1, wherein the quantum well layer in the single quantum well structure is represented by the general formula $In_xGa_yAl_zN$ (wherein, x+y+z=1, 0<x≦1, 0≦y<1, 0≦z<1).

3. The group 3–5 compound semiconductor according to claim 2, wherein the single quantum well layer has a thickness of 5 Å or more and 90 Å or less.

4. A light emitting diode obtained by using the group 3–5 compound semiconductor of claim 1.

5. The group 3–5 compound semiconductor according to claim 1, wherein the substrate comprises a sapphire.

6. The group 3–5 compound semiconductor according to claim 5, wherein the sapphire has a specular-polished C surface.

7. The group 3–5 compound semiconductor according to claim 1, wherein the thickness of the intermediate layer is 30 nm or more.

8. The group 3–5 compound semiconductor according to claim 1, wherein the group 3–5 compound semiconductor has a band gap of 0.1 eV or more and 5 eV or less.

* * * * *